United States Patent [19]

Forster et al.

[11] Patent Number: 4,649,527
[45] Date of Patent: Mar. 10, 1987

[54] ULTRASONIC PROXIMITY SWITCH

[75] Inventors: Alfred Forster, Schwandorf; Helmut Riss, Amberg; Heinz Walker, Kuemmersbruck, all of Fed. Rep. of Germany

[73] Assignee: Siemens Aktiengesellschaft, Berlin and Munich, Fed. Rep. of Germany

[21] Appl. No.: 762,123

[22] Filed: Aug. 2, 1985

[30] Foreign Application Priority Data

Aug. 3, 1984 [DE] Fed. Rep. of Germany ....... 3428773

[51] Int. Cl.$^4$ ................................................ G01S 7/52
[52] U.S. Cl. ........................................ 367/108; 367/93
[58] Field of Search .................. 367/93, 94, 108, 111, 367/114, 910

[56] References Cited

U.S. PATENT DOCUMENTS

| | | | |
|---|---|---|---|
| 3,060,427 | 10/1962 | Jaffe et al. | 367/108 |
| 3,562,703 | 2/1971 | Grada | 367/108 |
| 3,757,285 | 9/1973 | Ferré | 367/108 |
| 3,766,518 | 10/1973 | Rilett | 367/114 |
| 3,942,149 | 3/1976 | Westfall, Jr. | 367/108 |
| 4,439,846 | 3/1984 | Rodriguez | 367/108 |

OTHER PUBLICATIONS

Siemens Publication "Distanz–Sensor Ultraschall-BERO bis 1m" (Translation Not Available).
Motorola Semiconductors Publication "The European CMOS Selection".
"Das Grosse Werkbuch Electronik" (The Large Electronics Manual) by Dieter Nuehrman (Translation Not Available).

Primary Examiner—Richard A. Farley
Attorney, Agent, or Firm—Volker R. Ulbrich

[57] ABSTRACT

This invention is of an ultrasonic proximity switch having a range selection control circuit. The range selection control circuit is in this instance separated from the sensor by being installed in a separate housing which can be mounted in the switching unit. It is equipped with a potentiometer in the form of encoding switches and an actual value display which can be designed in the form of an LCD design. In addition, various selector switches can be mounted in the housing.

15 Claims, 3 Drawing Figures

ULTRASONIC PROXIMITY SWITCH

BACKGROUND OF THE INVENTION

This invention relates to the field of electrical acoustic sensory systems and more particularly to an ultrasonic proximity switch with a range selection, control and amplification circuit for use with a remotely locatable sensor.

In an existing ultrasonic proximity sensor unit (reference Distanz-Sensor Ultraschall-BERO bis lm function. Application and Design Engineering Publication No. E-733/1155) the sensor is mounted in a cubicle housing also incorporating therein both the control circuit and range selection. The operation of this known proximity unit is according to a program. Aside from the relatively large dimensions of this known ultrasonic proximity switch, the local installation requirements, e.g., minimum spacing from sidewalls, also need to be taken into account.

The object of this invention is to improve the ultrasonic proximity switch of the above-specified type so that an evaluating circuitry can be designed in a simpler and easier-to-use fashion. A further object of this invention is to provide an ultrasonic proximity switch without concerns for either spatial requirements or environmental factors, e.g., ambient temperature and correlated tolerance build-ups.

SUMMARY OF THE INVENTION

Briefly stated, in accordance with one aspect of the invention, these objects are achieved by providing an ultrasonic proximity switch (UPS) which can be used with one or more sensors having a range selection, control, and amplification circuit within a housing. The UPS is capable of being located remotely from the sensors. Setting of the range portion of the range selection, control, and amplification circuit is by potentiometer. The UPS has an actual value display electrically connected to the range selection, control, and amplification circuit, and mounted to the front of the housing.

A further simplification in terms of the potentiometer is attained by having the potentiometer comprise one digital encoding switch for each for the upper and lower range limits. Thus, the range can be set for any desired mangitude and any desired point within its detection range.

The use of a LCD display as the actual value display has proved advantageous. In contrast to an LED display, this offers lower power consumption and easier readout by daylight. As the potentiometer and actual value display are jointly mounted in the switching unit, simple operation and checking is possible. In this context it is advantageous if the actual value display shows the entire detection range of the proximity switch, regardless of the set operating range; thus objects can be detected in the switching unit which do not lead to a switching command.

A second embodiment of the invention, which has the advantage of the addition of a setting device for NC (normally closed) function or NO (normally open) function is coupled to a display indicator in the actual value display since this the type of function performed by the switch can be recognized in the switching unit. If a setting device is provided to select among various sensors, then one can manually switch to the different sensors using an evaluating device. For automatic determination of which sensor is connected, it is advantageous if the setting device consists of a switching arrangement which utilizes the varying indetification voltages of the sensors for the necessary accommodating switch-over. The system can operate without an additional line if the control circuit includes a pulse emitter to initiate the identification voltage since the scanning cycle can be preset. Here as well a display in the actual value display is advantageous. The actual value display can also indicate operating and functional errors. It is of further advantage if an output interface for the actual value is provided in the form of a plug connector. Thus the actual value can be supplied also to the control systems. In order to be able to preset setpoints for the ultrasonic proximity switch from any selected point, it is preferable if this system incorporates a switching device permitting switchover from internal setpoint adjustment to external setpoint presetting.

A third embodiment has the addition of a pulse-width evaluation circuit to the UPS through which erroneous pulses can be obviated. The transmitter will always transmit pulses of a specific width and if the returning pulses are wider or narrower than the pulse transmitted, they will not be considered. Thus, erroneous trigger actions will be greatly limited. If there is a device to change the cycle time for the transmitted pulses, which, for example, could be in the form of a random generator, then synchronous noise or even system-generated pulses will be eliminated as possible trigger pulses. If a pulse positon evaluation is available, then even better error screening is possible.

A fourth embodiment further eliminates noise pulses by incorporating further a device for an amplification change in case of constant noise signals. If, for example, there is a source of a rotational noise level, e.g., discharging compressed air, then the amplification of the amplifier is modified. If, however, there is an isolated signal, then the amplification change is lifted for a short time and the isolated pulse is detected as a received pulse and processed properly.

BRIEF DESCRIPTION OF THE DRAWINGS

While the specification concludes with claims particularly pointing out and distinctly claiming the subject matter which is regarded as the invention, it is believed that the invention will be better understood from the following description to the preferred embodiment taken in conjunction with the accompanying drawings in which:

DESCRIPTION OF A PREFERRED EMBODIMENT

Figure 1:
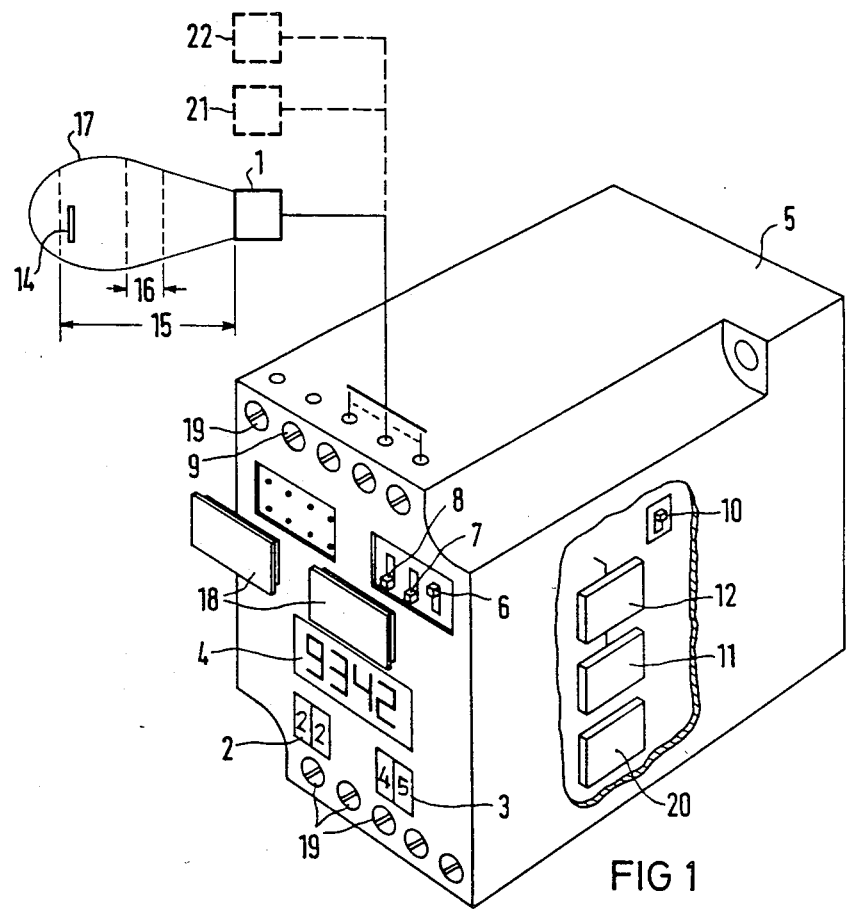
FIG. 1 illustrates the major aspects of the design of the ultrasonic proximity switch in a partially cutaway perspective view.

The ultrasonic proximity switch shown in FIG. 1 designated below as switch, consists of the sensor 1 with the amplification circuit and the housing 5 which incorporates the range-finding control circuit consisting in this example of the potentiometer comprising two encoding switches 2, 3 and also housing the actual value display 4. The encoding switches 2 and 3 consist in this example of two commercially accessible single-digit encoding switches. The actual value display 4 is designed as an LCD display. Moreover, housing 5 incorporates a setting device 6 in the form of a selector switch which resets the switch from opening to closing function and is coupled to a display indicator in the actual value display 4. A setting mechanism 7, also designed as a selector switch, selects among various sensors and can switch sensors of varying designs by utilizing corresponding accommodating elements.

The setting mechanism 7 can also be designed as a circuit utilizing for the accommodating selective switching cycle the various identification voltages of the different sensors 1, 21, 22 shown in broken line in FIG. 1. For that purpose the control circuit has a pulse output which leads the individual sensors 1, 21, 22 to emit the identification voltage, whereby the control circuit automatically accommodates to the connected sensor. Thereupon the control circuit issues the transmission pulse length and cycling time required for the sensor, also taking into account the other operating parameters, e.g., error pulses and acoustic interference suppression. The control circuit provides the pulse required for initiating the identification voltage. Only during the pulse duration itself does the identification voltage flow through the control circuit. For reliability several sequential pulses are emitted to generate an average value for the identification voltages. Only thereafter does the actual accommodation take place. Said average-value generation takes place only if the accommodation for the connected sensor has been performed erroneously.

Moreover, a selector device 8 is incorporated to switch from internal setpoint generation to external presetting which also can be designed in the form of a selector switch. In order to be able to read out the actual value at another display, there is an output interface 9 in the form of a plug connector. A selector device 10 for cyclical scanning of several sensors known as the so-called multiplex procedure (Motorola, the European Cmos Selection 1979, 9-4-16) can be included inside the housing since said switchovers during operation are not required. The connection for the sensors, which can be of any number, can be mounted on the rear of housing 5. The sensors can be positioned locally in close proximity without having any effect on each other. Since at any given time only one sensor is on briefly, power consumption is reduced.

Figure 2:
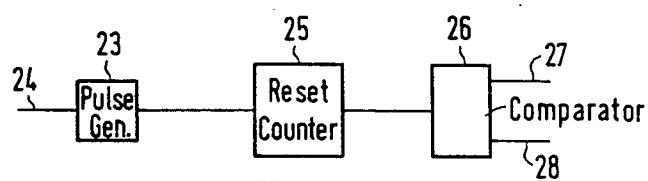
FIG. 2 shows a functional block diagram for the pulse-width evaluation circuit.

A pulse width evaluation 11 increases the operating reliability of the ultrasonic proximity switch. The sensor emits pulses of a certain width. When returning pulses are wider or narrower than the pulses sent, they are not responded to. For that purpose one can use, for example, a circuit as may be seen in FIG. 2. The circuit consists, for example, of a pulse generator 23 started by the leading edge of an echo pulse 24. Said pulse generator 23 is connected to a reset counter 25 whose counter status is transmitted ot a comparator circuit 26. Said comparator circuit 26 compares the counter status to a set value in accordance with the connected sensor. The control circuit then decides over outputs 27, 28 whether the pulse is to be evaluated or not. As soon as the trailing edge of the echo pulse reaches the pulse generator 23, counter 25 also shuts down. The evaluation only takes place after the counter has stopped. In order further to monitor the echo pulses which were evaluated by the pulse width evaluation as pulses to be countered in terms of their interference-free characteristics, a pulse position evaluation circuit 20 is provided.

Figure 3:
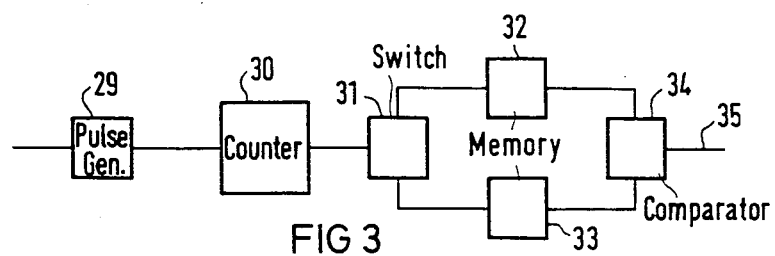
FIG. 3 shows a functional block diagram for the pulse position evaluation circuit.

A possible circuit schematic for said pulse position evaluation can be seen in FIG. 3. For that purpose, as also shown in the example in FIG. 2, there is a pulse generator 29 started by the leading edge of the sending pulse. The pulse generator 29 acts upon a counter 30. By the leading edge of the echo pulse, counter 30 is stopped and then stored either in memory 32 or 33 by a selector switch mechanism 31. After repeated counting sequences the selector switch stores the counted value in the opposite memory 32 or 33. The values counted here are compared with each other by the comparative circuit 34 and over the output value 35 supplied to the control circuit. The comparative values evaluated as positive depend in turn on the sensor type and the selected tolerances. It is, however, also possible to stop the pulse generator and counter 30 using the leading edge of the sending pulse. Using the leading edge of the echo pulse, the value of counter 30 is inputted into a memory by the selector switch. The counter continues to run until attaining the leading edge of the next echo pulse and then stores the total value in another memory. This can be repeated several times. The values of the present cycle are compared to the values of the preceding cycle. Thereby, further noise echos can be eliminated. To prevent error pulses from the system frequency as well, there is a device 12 which along the line of a random generator changes the cycling time of the sending pulse in an irregular fashion so that any coincidence with the system frequency which could possibly be recognized as an echo, is excluded. Said circuits are known, for example, from Tietze. Schenk, Semi-Conductor Switching Technology, Springer Publishing House, 5th edition pages 509 through 512. In order to be able to screen out interference due to constant ultrasonic pulses transmitted by other devices, a device to change the amplification has been provided. Thereby, the amplification is reduced in the case of a continuous noise level to the extent that triggering of the switch is avoided. If shorter pulses appear, then they are amplified normally and supplied to the evaluating circuit. For the amplification control, a circuit can be utilized as known from "The Large Electronics Manual," Dieter Nuehrmann, 4th edition, page 987, FIG. 3.3.9. The actual value display 4 can be utilized not only to indicate the actual value, but also for assistance in setting the limits of the setpoints by means of the two encoding switches 2, 3, wherein encoding switch 2 reproduces the lower limit and encoding switch 3 the upper limit of the set value. Further operating statuses can also be displayed here. An object 14 can be indicated by the display if it is within detection range 15, even when its position does not fall within the specified switching range 16 defined by the two encoding switches 2 and 3 of the ultrasonic beam 17 of sensors 1 or 21, 22. As already noted, the actual value display can also indicate the opening or closing function as well the further ability to indicate operating and functional errors. For that purpose certain symbols are utilized since any explicit text information would require too much space. The connection of the individual functions can be handled by a microprocessor; as the entire control circuit is separated from the actual sensor 1, the size of the device is not of any great significance. In addition, the temperature parameters in a switching unit that can be air-conditioned are substantially more advantageous than at the point of installation of sensor 1, 21 or 22.

To avoid unauthorized actuation of devices 6 or 8 or unauthorized impact on the output interface 9, output interface covers 18 have been provided. For that purpose devices 6 to 8 or the output interface 9 can be mounted as countersunk plug connectors or surrounded by a collar into which covers 18 can be snapped. The connections for switching functions, etc. are incorporated on the front panel of housing 45 in accordance with the type of known switching units. Housing 5 can also be designed in such a form that said housing can be mounted in series with similar devices. The fastening of housing 5 is then designed in a corresponding fashion, for example, as a snap mechanism.

Thus, it will now be understood that there has been disclosed an improved ultrasonic proximity switch of a less complex and easier to use evaluation circuit reducing the concerns for spatial requirements and environmental factors.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. For Use with a sensor an ultrasonic proximity switch, UPS, with a range selection, controla and amplification circuit comprising:
   - a housing in which the range selection, control and amplification circuit of the ultrasonic proximity switch are house, said housing being remotely locatable from the sensor;
   - a potentiometer mounted to said housing and electrically connected to the range selection, control and amplification circuit for setting the range;
   - a first potentiometer consisting of a first encoding switch electrically connected to said range selection, control and amplification for setting a minimum range limit;
   - a second potentiometer consisting of a second encoding switch electrically connected to said range selection, control and amplification circuit for setting a maximum range limit; and
   - an actual value display electrically connected to said range selection, control and amplification circuit and displaying a range to an object regardless of the settings of said first and second encoding switches.

2. UPS according to claim 1, wherein said actual value display is an LCD display.

3. UPS according to claim 1, further comprising:
   - a first setting mechanism mounted on said housing capable of selecting either a normally closed or a normally open switch function for the UPS; and
   - an indicator as part of said actual value display to indicate whether a NO or a NC function has been selected.

4. A UPS according to claim 1, further comprising a sensor selector setting mechanism for selecting among a plurality of sensors connected to the range selection, control, and amplification.

5. A UPS according to claim 4, wherein the sensor selector setting mechanism is a switching circuit utilizing varying identification voltages of the respective sensors to accomplish the switching for the selection.

6. A UPS according to claim 5, wherein the varying identification voltages are initiated by issuance of pulses by amplification circuit.

7. A UPS according to claim 1, further comprising a plug connector connected mechanically to the housing and electrically to the actual value display, providing an output interface for the actual value display.

8. A UPS according to claim 1, further comprising a selector switch electrically connected to the range selection, control and amplification circuit which provides for switching from the internal range limit settings to external preset range limits.

9. A UPS according to claim 3, wherein the first setting mechanism is located on the front panel of the housing and further comprising a cover fitting thereover.

10. A UPS according to claim 7, wherein the output interface is located on the front panel of the housing and further comprising an interface cover fitting thereover.

11. A UPS according to claim 5, further comprising a selector switch mechanism within the range selection, control and amplification circuit for a cyclic scanning of the plurality of sensors.

12. A UPS according to claim 8, further comprising means for evaluating a pulse-width mounted within the housing and a part of the range selection, control, and amplification circuit.

13. A UPS according to claim 1, further comprising means for changing the cycling time for transmitting ultrasonic ranging pulses as part of the range selection, control and amplfcation circuit.

14. A UPS according to claim 1 means for modifying the amplification of the range selection, control and amplifications circuit to provide operation in the presence of continuous acoustic noise signals.

15. A UPS according to claim 1, further comprising means for evaluating a pulse position within the range selection, control and amplification circuit.

* * * * *